United States Patent [19]
Apel

[11] Patent Number: 5,349,306
[45] Date of Patent: Sep. 20, 1994

[54] APPARATUS AND METHOD FOR HIGH PERFORMANCE WIDE-BAND POWER AMPLIFIER MONOLITHIC MICROWAVE INTEGRATED CIRCUITS

[75] Inventor: Thomas R. Apel, Sunnyvale, Calif.

[73] Assignee: Teledyne Monolithic Microwave, Mountain View, Calif.

[21] Appl. No.: 143,314

[22] Filed: Oct. 25, 1993

[51] Int. Cl.$^5$ .............................................. H03F 3/16
[52] U.S. Cl. ................................. 330/277; 330/286; 330/306; 330/54
[58] Field of Search ............... 330/277, 286, 302, 307, 330/306, 54

[56] References Cited

U.S. PATENT DOCUMENTS

| | | | |
|---|---|---|---|
| 4,446,445 | 5/1984 | Apel | 330/269 |
| 4,540,954 | 9/1985 | Apel | 330/286 |
| 4,890,077 | 12/1989 | Sun | 333/81 A |
| 4,967,169 | 10/1990 | Sun et al. | 333/28 R |
| 5,021,743 | 6/1991 | Chu et al. | 330/54 |

OTHER PUBLICATIONS

Monolithic Circuits Symposium, Digest of Papers Jun. 1, 1983 The IEEE Microwave Theory and Techniques Society pp. 100–104.

*Filters, image-parameter design*, Radio Engineers, 4th Edition, Chapter 6, pp. 164–187, IT&T Corp. 1956.

Matthaei, Young and Jones, *Microwave Filters, Impedance Matching Networks and Coupling Structures*, Chapter 3, pp. 49–84, McGraw-Hill 1964.

*Primary Examiner*—James B. Mullins
*Assistant Examiner*—Jim Dudek
*Attorney, Agent, or Firm*—Townsend and Townsend Khourie and Crew

[57] ABSTRACT

A distributed amplifier produced from monolithic microwave integrated circuit (MMIC) processes employs a bandpass filter structure as opposed to a low-pass filter network to enhance gain, efficiency and output power over wideband operation of 6 GHz to 18 GHz. Derivation of the preferred embodiment is shown from a three port circuit employing bandpass filter image-parameter half-sections.

2 Claims, 7 Drawing Sheets

APPARATUS AND METHOD FOR HIGH PERFORMANCE WIDE-BAND POWER AMPLIFIER MONOLITHIC MICROWAVE INTEGRATED CIRCUITS

BACKGROUND OF THE INVENTION

The present invention relates generally to power amplifiers. More specifically, the present invention relates to a distributed power amplifier in a monolithic microwave integrated circuit. Monolithic microwave integrated circuits employ "distributed amplifiers" to provide extremely broadband amplification. Distributed amplifiers have a flat frequency response from essentially direct current all the way to as high as tens of Gigahertz. Edward L. Ginzton, et al. reported the use of the distributed amplifier, also referred to as a traveling wave amplifier, in a paper entitled "Distributed Amplification" published August, 1948 in the Proceedings of the IRE, hereby expressly incorporated by reference for all purposes.

Since the introduction of the distributed amplifier concept, there have been many improvements. For example, U.S. Pat. No. 4,446,445 entitled Singly Terminated Push-Pull Distributed Amplifier, issued May 1, 1984 and U.S. Pat. No. 4,540,954 entitled Singly Terminated Distributed Amplifier, both hereby expressly incorporated by reference for all purposes, illustrate improvements in distributed amplifiers.

FIG. 8 is a block diagram of a conventional distributed amplifier 800. Distributed amplifier 800 includes an input transmission line 802, an output transmission line 804, a plurality of equalizing transmission lines $806_i$, a plurality of FET devices $808_i$, an input transmission line terminating impedance 810, and an output line terminating impedance 812. FET devices $808_i$ include a gate-source capacitance and a drain-source capacitance. FET devices $808_i$ couple input transmission line 802 to output transmission line 804. FET devices $808_i$ are spaced uniformly along the transmission lines with the gates coupled to input transmission line 802, the drains coupled to output transmission lines 804, and the sources connected to ground. The gate-source capacitances periodically load input transmission line 802, while the drain-source capacitances periodically load output transmission line 804. The drain-source capacitances of the FET devices $808_i$ are not always sufficient to equalize the characteristic impedances and velocities of the transmission lines, therefore equalizing transmission lines $806_i$ are sometimes put in series with the drain-source capacitances. It is well-known to model the transmission lines as a series of periodic series inductances and shunt capacitances. Thus, input transmission line 802 includes input inductances $814_i$, associated with FET gate to source capacitances, and output transmission line 804 includes output impedances $816_i$, associated with FET drain to source capacitances.

FIG. 9 is a schematic representing a model for an equivalent circuit of distributed amplifier 800 shown in FIG. 8. This model results from replacing the plurality of FET devices $808_i$ with a current source $902_i$ and a capacitance $904_i$ (the source/drain capacitance) for the output transmission line side. For the input transmission line side, the gate source capacitance is modeled by capacitance $906_i$. The equivalent circuit incorporates a classic low-pass filter design.

FIG. 10 is a block schematic diagram illustrating conventional use of a large inductive element 950 to isolate a drain voltage source from low-pass network structures in a distributed amplifier, such as distributed amplifier 800 in FIG. 8. To operate distributed amplifier 800, it is necessary to bias the drains of the plurality of FET devices $808_i$ as well-known. Inductive element 950 has a relatively large, at frequencies of interest, reactance that couples a bias voltage from a voltage source 952 to the drains of the plurality of FET devices. The reactance of inductive element 950 is large enough to isolate voltage source 952 from the distributed amplifier network so as to preserve the frequency characteristics, the low-pass filter characteristics, of distributed amplifier 800.

Inductive element 950 carries relatively large currents, typically on the order of one amp or more, therefore an integrated circuit including a distributed amplifier like distributed amplifier 800 employs wide metalization lines to adequately handle this current. The wider the metalization lines become, associated parasitic capacitance of the lines, which comprise the induction element 950, becomes a more significant factor. This associated parasitic capacitance limits wideband practicality of the conventional distributed amplifier.

SUMMARY OF THE INVENTION

The present invention provides apparatus and method for simply, efficiently and economically providing a distributed amplifier without a large inductor, as used in the prior art, limiting power handling of the integrated circuit.

According to one aspect of the invention for a distributed amplifier used in a monolithic microwave integrated circuit (MMIC), the distributed amplifier includes an integrated circuit substrate, an input transmission line formed on the substrate. The transmission line includes a plurality of taps and provides for a signal propagation delay between each of the taps. A plurality of FETs are formed on the substrate, one connected to each of the taps. The distributed amplifier incorporates a bandpass filter network having a plurality of bandpass input ports, and an output port. The bandpass filter is characterized by having a lower and an upper cut-off frequency. Connection of the bandpass filter permits coupling of a drain bias DC voltage signal to drains of the FETs without the need for a large "choke" inductor. The gates of the FETs are connected to the taps of the transmission line while the sources of the FETs are connected to ground. In the preferred embodiment, the distributed amplifier is constructed in two sections employing the bandpass networks rather than the conventional lowpass image-parameter network.

In operation, the distributed amplifier provides improved output over wideband frequencies. In the preferred embodiment, a distributed power amplifier which covers a range of 6–18 Gigahertz has been realized. The single chip typical power level for a MMIC employing a distributed amplifier according to the preferred embodiment has been demonstrated to be +34.5 dBm with an efficiency of 16% to 22%. The chip size is on the order of 6.5 mm ×5.1 mm. MMICs employing distributed amplifiers embodying the present invention provide more gain than is typically available from conventional octave (or wider) band power MMICs. Typical gains of +20 dB are available from distributed amplifiers of the present invention. The preferred embodiment simultaneously provides improved gain, power and circuit density to achieve a significant advancement in single chip performance.

Other features, improvements and enhancements of the present invention will be apparent upon reference to the remaining portions of the specification, including the figures and claims.

DESCRIPTION OF THE PREFERRED EMBODIMENT

Figure 1:
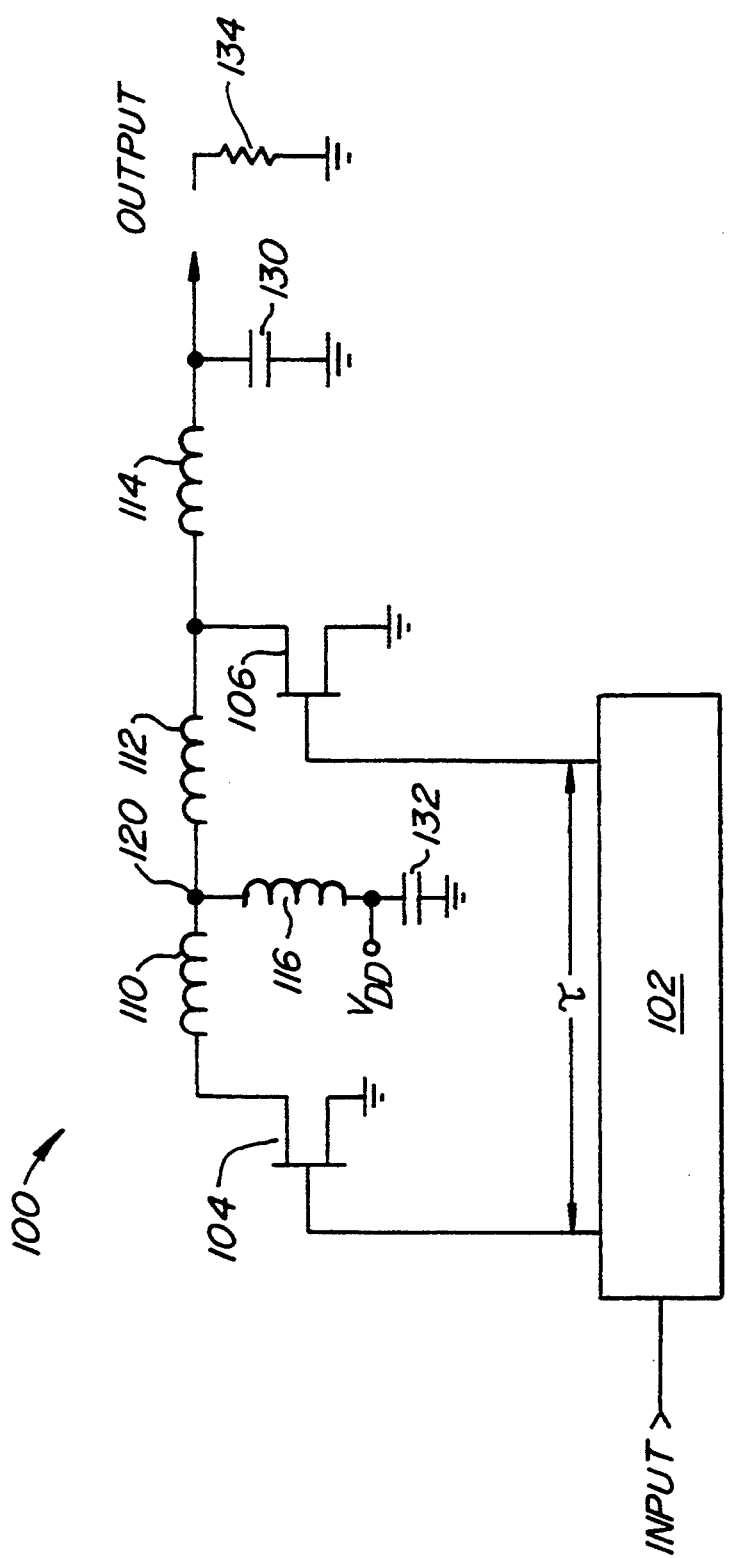
FIG. 1 is a schematic diagram of a two-section distributed amplifier 100 according to the preferred embodiment of the present invention.

FIG. 1 is a schematic diagram of a two-section distributed amplifier 100 according to the preferred embodiment of the present invention. Distributed amplifier 100 includes an input transmission line 102 providing an input signal propagation delay $\tau$ between application of an input signal to gates of a first section field-effect transistor (FET) 104 and a second section FET 106. FET 104 and FET 106 each include a source terminal coupled to ground and a drain terminal coupled to a bandpass filter network. The bandpass filter network includes inductive elements 110, 112, 114 and 116. Inductive element 110 and inductive element 112 are series connected between the drain of FET 104 and the drain of FET 106. Inductive element 114 couples the drain of FET 106 to an output port. Inductive element 116 couples a drain supply voltage $V_{DD}$ to node 120, a point between series-connected inductive elements 110 and 112. A capacitive element 130 is connected between the output port and ground, and a capacitive element 132 couples inductor 116 to ground. A load, modeled as a resistive element 134, is shown at the output port. As is well-known in the art, the inductive elements may be realized, using MMIC techniques, as appropriate lengths of transmission line. Thus, inductive elements such as inductive element 110, inductive element 112, inductive element 114 and inductive element 116, are realized with appropriately designed transmission line segments.

In operation, the distributed amplifier 100 receives an input signal at the input port. The input transmission line 102 applies the input signal to the gate of FET 104, and after the input signal propagation delay $\tau$, input transmission line 102 applies the signal to the gate of FET 106. The bandpass filter network combines the amplified input signals obtained from the FETs by constructively adding output currents from FET 104 and FET 106. Note that the bandpass filter network includes an inductive element, inductor 116, coupling $V_{DD}$ to the drains of the FETs. However, in this invention, inductive element 116 is part of the bandpass filter network and therefore has an impedance on the same order of magnitude as the other inductive elements.

Figure 2:
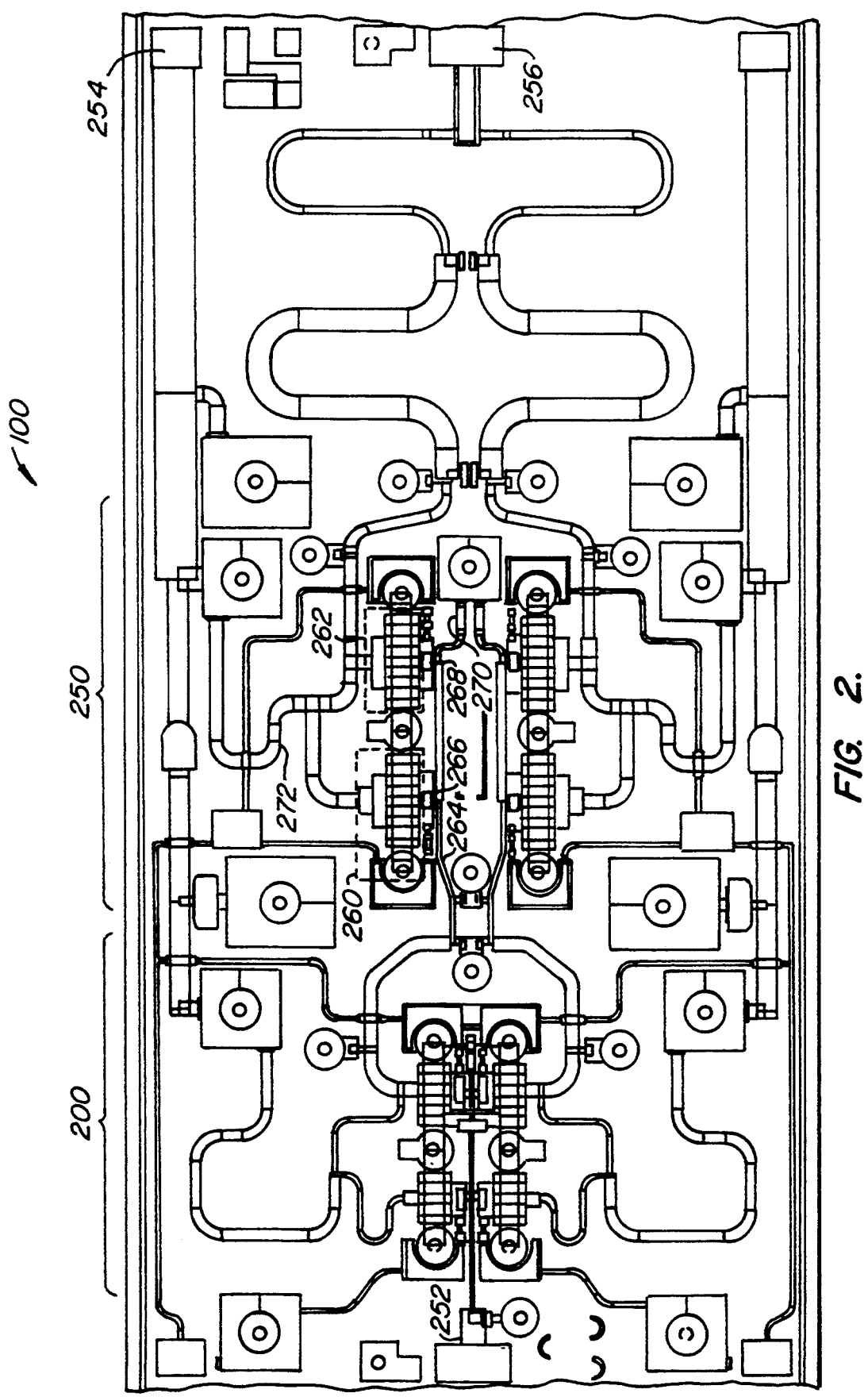
FIG. 2 is a circuit layout of the distributed amplifier 100 using MMIC techniques.

FIG. 2 is an integrated circuit layout of the distributed amplifier 100 using MMIC techniques. The following discussion highlights some of the features of the circuit layout. As well-known, real world applications realize microwave circuit by mirroring circuits, therefore the features duplicated in the top one-half of FIG. 2 are reproduced in the bottom one-half and will not be further described. Distributed amplifier 100 is preferably embodied in two stages, a first stage 200 and a second stage 250. Each stage implements the circuit shown in FIG. 1, and includes two FETs and a bandpass filter network. Functionally, stage 200 is similar to stage 250, therefore only stage 250 will be described further.

The circuit includes a pad 252 for receiving an input signal (marked RF IN), a pad 254 for receiving drain supply voltage (marked VD), and a pad 256 for providing the output signal (marked RF OUT). Structures encircled by dashed lines at 260 generally describe FET 104 and structures encircled by dashed lines at 262 generally describe FET 106. A structure 264 is the input transmission line, a structure 266 connects structure 264 to the gate of FET 104, and a structure 268 connects structure 264 to the gate of FET 106. A structure 270 identifies a terminating impedance. Structures 264, 266, 268, 270 comprise the input network 100. A structure 272 identifies an output transmission line intercoupling a drain of structures 260, a drain of structures 262, pad 254 and pad 256. As noted above, lengths of structure 272 are modeled as inductive elements, therefore, inductive element 110, inductive element 112, inductive element 114 and inductive element 116 are provided for by appropriate portions of structure 272. For example, inductive element 110 and inductive element 112 are provided by those portions of structure 272 between structures 260 and structures 262.

FIG. 3 through FIG. 7 illustrate a derivation of the preferred form of the distributed amplifier 100 of FIG. 1. The derivation begins with an image parameter half-section for a bandpass filter structure and shows the development through to the preferred circuit of FIG. 1. Note that image parameter filter design is well-known and other image parameter half-sections in addition to the particular bandpass half-section, other than the low pass filter half-section, are contemplated to provide effective distributed amplifier functionality for particular applications. A detailed description of image-parameter design for filters is beyond the scope of the present application and will not be further described herein. One source for a more thorough discussion of filter design using image-parameters is Microwave Filters, Impedance Matching Networks, and Coupling Structures, by Matthaei, Young and Jones, McGraw-Hill 1964, hereby expressly incorporated by reference for all purposes.

Figure 3:
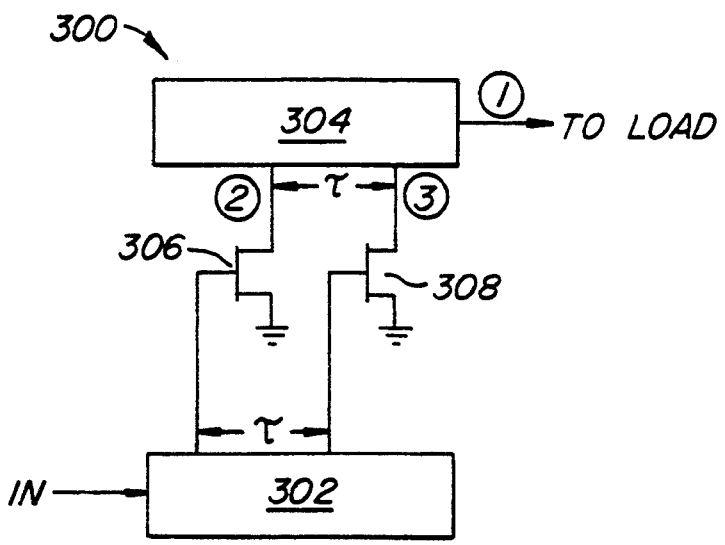
FIG. 3 is a generic block diagram of a two-section distributed amplifier 300.

FIG. 3 is a generic block diagram of a two-section distributed amplifier 300. Distributed amplifier 300 includes an input transmission line network 302, an output transmission line network 304, an FET 306, and an FET 308. An input signal propagation delay $\tau$ of transmission line 302 delays application of an RF input signal as described previously. FIG. 3 includes three node identifiers, a node 1, a node 2 and a node 3. These node identifiers illustrate correspondence of nodes of FIGS. 3–7, with similarly numbered nodes in these figures identifying the same node.

Figure 4:
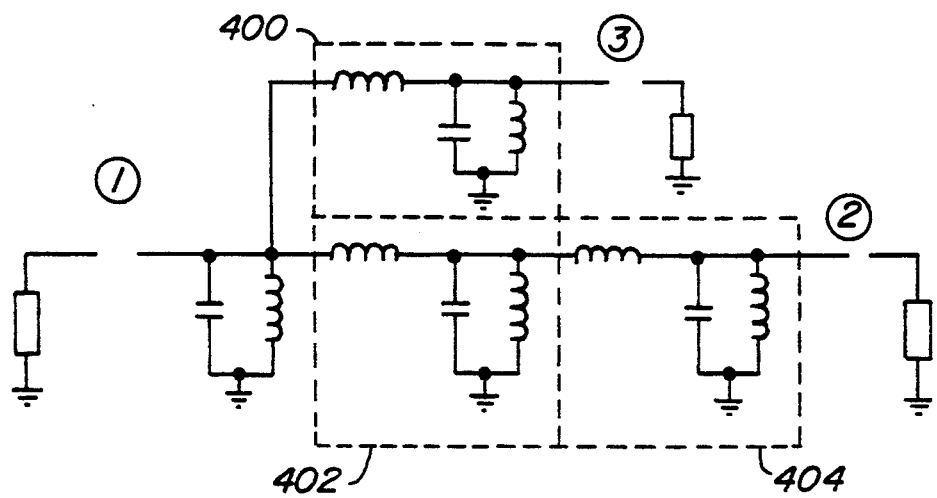
FIG. 4 is a schematic diagram illustrating formation of a three port image-parameter network using bandpass half sections.

FIG. 4 is a schematic diagram illustrating formation of a three port image-parameter network using a bandpass half-section. The bandpass half-section selected is a 3-element shunt using parallel connected capacitive and inductive elements coupled to ground, and including a second inductive element. The circuit elements enclosed in box 400 identify one representation of a bandpass filter half-section. The circuit of FIG. 3 illustrates that currents arriving at node 1, provided from FET 306 and FET 308, travel different distances. The current provided from FET 306 travels further than the current from FET 308. To model this implementation, a path from node 1 to node 2 includes one more half-section than a path from node 1 to node 3. Therefore, the path from node 1 to node 3 includes element 400 while the path from node 1 to node 2 includes element 402 and element 404. The circuit shown in FIG. 4 is one example of forming a three-port network, with variations possible as well-known.

Figure 5:
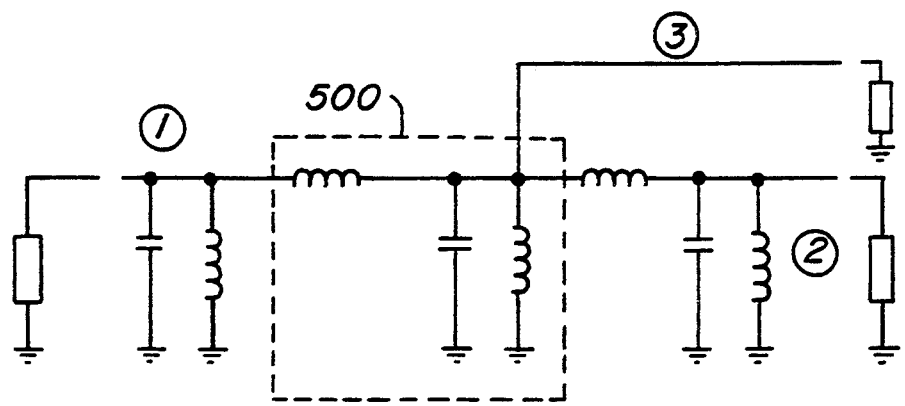
FIG. 5 is a schematic diagram showing the circuit of FIG. 4 after combining common elements.

FIG. 5 is a schematic diagram showing the circuit of FIG. 4 after combining common elements. Element 400 and element 402 of FIG. 4 are combined to form element 500 of FIG. 5.

Figure 6:
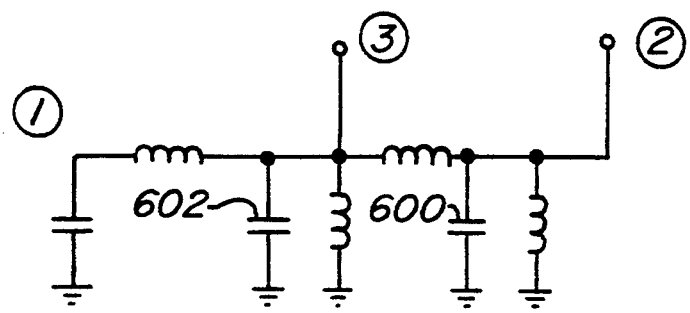
FIG. 6 is a schematic diagram of the circuit of FIG. 5 rewritten in simplified form.

FIG. 6 is a schematic diagram of the circuit of FIG. 5 rewritten in simplified form. The input and output loads are removed, for example. The circuit of FIG. 6 includes a capacitive element 600 and a capacitive element 602.

Figure 7:
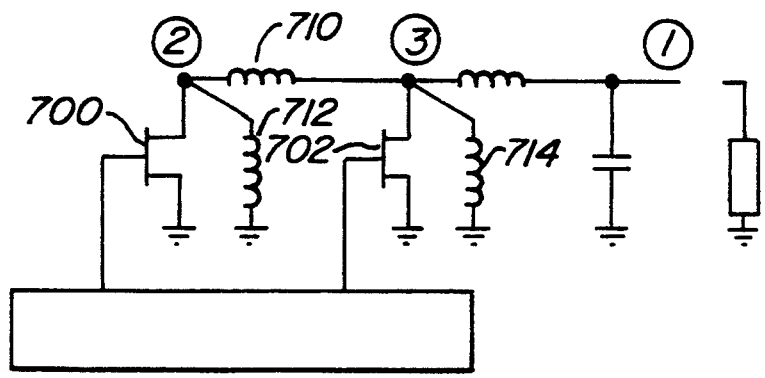
FIG. 7 is a schematic diagram of the circuit of FIG. 6 after substituting a gate-drain capacitance of an FET for the capacitive elements and reversing an orientation of the circuit.
Figure 8:
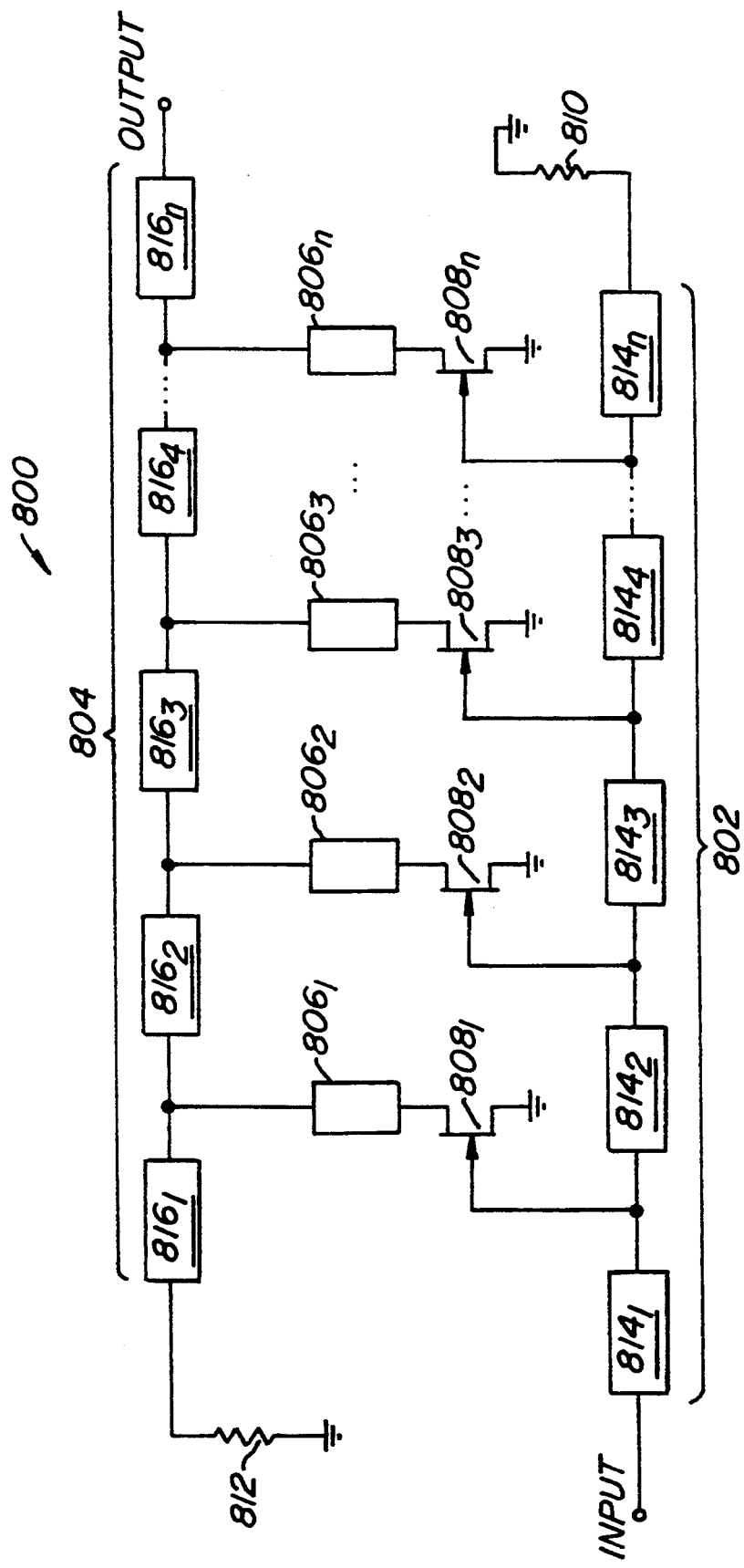
FIG. 8 is a block diagram of a conventional distributed amplifier 800.
Figure 9:
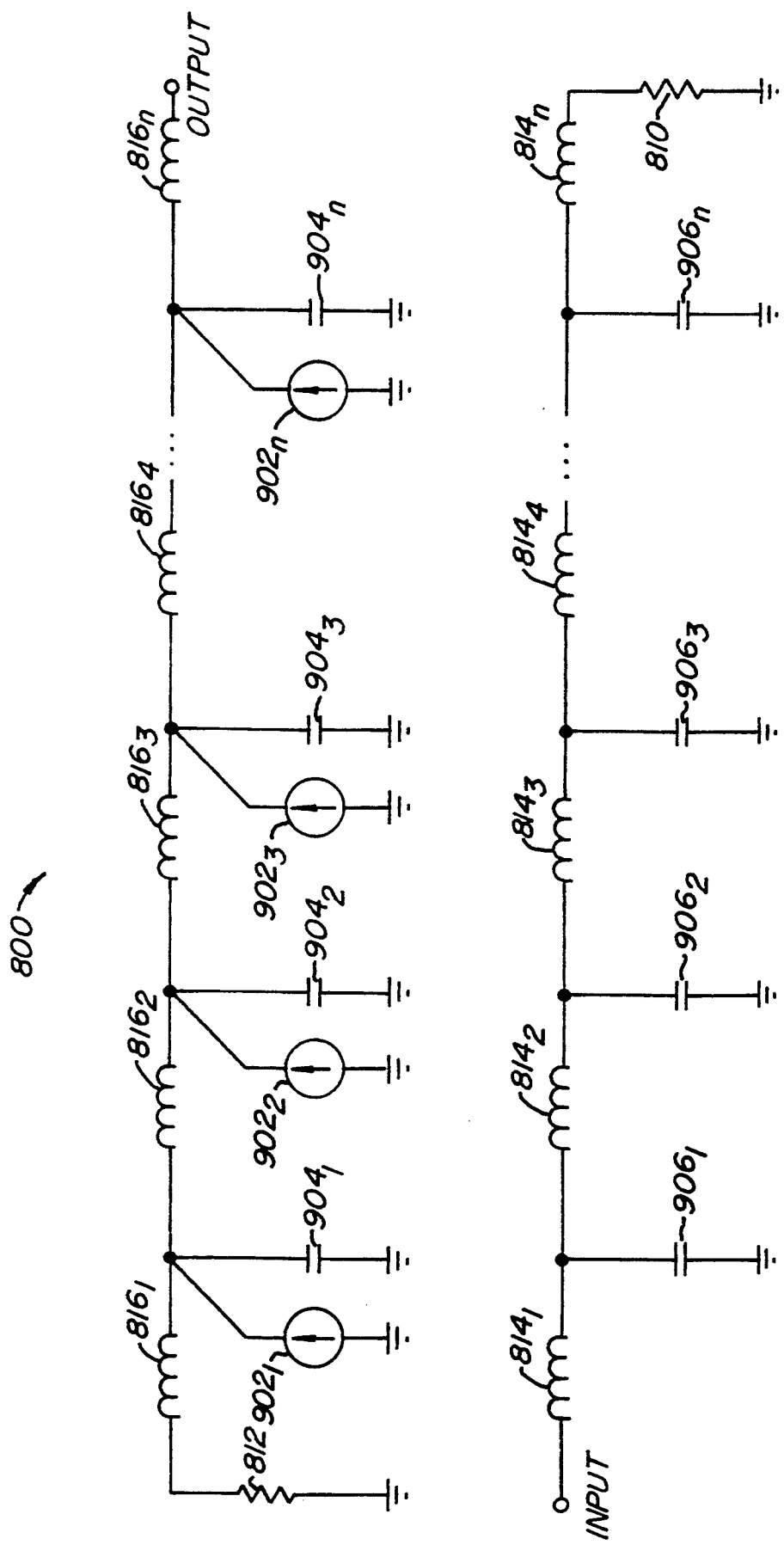
FIG. 9 is a schematic representing a model for an equivalent circuit of distributed amplifier 800 shown in FIG. 8.
Figure 10:
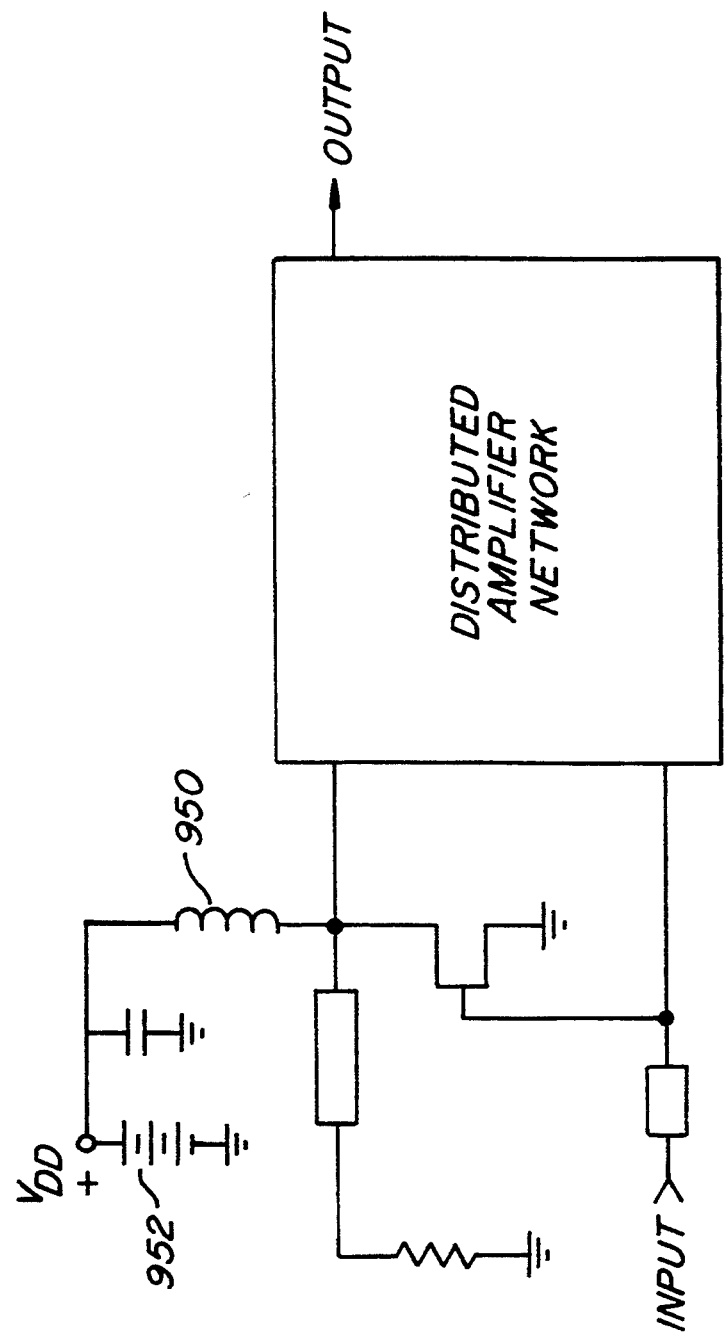
FIG. 10 is a block schematic diagram illustrating conventional use of a large inductive element 950 to isolate a drain voltage source from low-pass network structures in a distributed amplifier.

FIG. 7 is a schematic diagram of the circuit of FIG. 6 after substituting a gate-drain capacitance of an FET for the capacitive elements and reversing an orientation of the circuit. An FET 700 provides a gate-drain capacitance representing capacitive element 600 in FIG. 6 and an FET 702 provides a gate-drain capacitance representing capacitive element 602. The three-port circuit of FIG. 7 includes three inductive elements, an inductance 710, an inductance 712 and inductance 714, all connected in a DELTA configuration. By performing a well-known DELTA-to Y conversion, the circuit of FIG. 7 is transformed into the equivalent circuit shown in FIG. 1. Inductive element 710, inductive element 712 and inductive element 714 are modeled by inductive element 110, inductive element 112 and inductive element 116, and FET 700 corresponds to FET 104 while FET 702 corresponds to FET 106. Node 1 of FIG. 7 becomes the output port of FIG. 1.

In conclusion, the present invention provides a simple, efficient solution to a problem of improving output power, gain and efficiency for integrated microwave circuits operating over a wide range of frequencies. While the above is a complete description of the preferred embodiments of the invention, various alternatives, modifications, and equivalents may be used. While the derivation of the preferred embodiment was shown by reference to one particular implementation of a bandpass three-element shunt half-section, other image parameter half-sections can be used to produce other variations of the filter network on the output filter network. Additionally, the preferred embodiment implements the distributed amplifier stages in two sections. In other applications, the stages may be implemented with other numbers of sections, or stages, depending upon particular applications. Therefore, the above description should not be taken as limiting the scope of the invention which is defined by the appended claims.

What is claimed is:

1. A distributed amplifier, comprising:
   an integrated circuit substrate;
   an input transmission line formed on said integrated circuit substrate, said input line having a first tap, a second tap and a signal propagation delay from said first tap to said second tap;
   a bandpass filter having first and second bandpass input ports and a bandpass output port, characterized by upper and lower cut-off frequencies, and connected to receive a drain bias DC voltage signal;
   a first FET and a second FET, each FET including a source, a gate and a drain formed on said substrate wherein said gate of said first FET is coupled to said first tap, said gate of said second FET is coupled to said second tap, said drain of first FET coupled to said first bandpass input port and said drain of said second FET coupled to said second bandpass input port to introduce a delay between signals generated at the drains of said first and second FETs and to bias the drains of the FETs with said drain bias DC voltage signal.

2. The distributed amplifier of claim 1 wherein said bandpass filter network comprises:
   a first reactance and a second reactance, each having a low impedance for frequencies below the lower cutoff frequency, coupled in series between said drains of said first FET and second FET; and
   a third reactance, characterized by a low impedance for frequencies below the lower cutoff frequency, coupled to a tap between said first and second reactances and a drain bias voltage source.

* * * * *